US010522624B2

(12) United States Patent
Van Houdt

(10) Patent No.: US 10,522,624 B2
(45) Date of Patent: Dec. 31, 2019

(54) V-GROOVED VERTICAL CHANNEL-TYPE 3D SEMICONDUCTOR MEMORY DEVICE AND METHOD FOR MANUFACTURING THE SAME

(71) Applicant: IMEC vzw, Leuven (BE)

(72) Inventor: Jan Van Houdt, Bekkevoort (BE)

(73) Assignee: IMEC vzw, Leuven (BE)

( * ) Notice: Subject to any disclaimer, the term of this patent is extended or adjusted under 35 U.S.C. 154(b) by 0 days.

(21) Appl. No.: 15/824,805

(22) Filed: Nov. 28, 2017

(65) Prior Publication Data
US 2018/0182851 A1   Jun. 28, 2018

(30) Foreign Application Priority Data

Dec. 27, 2016   (EP) .................................... 16206986

(51) Int. Cl.
*H01L 29/10*   (2006.01)
*H01L 27/11597*   (2017.01)
*H01L 27/11556*   (2017.01)
*H01L 45/00*   (2006.01)
*H01L 27/24*   (2006.01)
*H01L 27/11524*   (2017.01)
*H01L 27/1157*   (2017.01)
*H01L 27/11582*   (2017.01)

(52) U.S. Cl.
CPC ...... *H01L 29/1037* (2013.01); *H01L 27/1157* (2013.01); *H01L 27/11524* (2013.01); *H01L 27/11556* (2013.01); *H01L 27/11582* (2013.01); *H01L 27/11597* (2013.01); *H01L 27/2481* (2013.01); *H01L 45/04* (2013.01); *H01L 45/06* (2013.01); *H01L 45/08* (2013.01); *H01L 45/1226* (2013.01)

(58) Field of Classification Search
CPC ........... H01L 29/1037; H01L 27/11556; H01L 27/11597; H01L 27/2481; H01L 45/06; H01L 45/08
USPC ........................................................ 257/314
See application file for complete search history.

(56) References Cited

U.S. PATENT DOCUMENTS

| 2010/0155810 | A1  | 6/2010  | Kim et al. |
| 2011/0018052 | A1* | 1/2011  | Fujiwara ............ H01L 27/11526 257/324 |
| 2012/0211819 | A1* | 8/2012  | Alsmeier ............ H01L 27/11551 257/319 |
| 2014/0361360 | A1  | 12/2014 | Alsmeier et al. |
| 2015/0021537 | A1* | 1/2015  | Xie ...................... H01L 45/1616 257/2 |
| 2015/0179661 | A1* | 6/2015  | Huo ....................... H01L 21/764 257/57 |

(Continued)

*Primary Examiner* — Cuong Q Nguyen
(74) *Attorney, Agent, or Firm* — Knobbe Martens Olson & Bear, LLP

(57) ABSTRACT

A method of fabricating a vertical channel 3D semiconductor memory device is disclosed. In one aspect, the method comprises providing a stack of alternating layers of conductive material and dielectric material on a major surface of substrate, providing in the stack at least one trench, having sloped sidewalls sloping towards the major surface, extending at least below the lowest layer of conductive material, forming, in order, a programmable material, a channel liner, and a filler material on the sidewalls of the trench. Thereby, the method forms a memory string, and an electrode to the channel liner at opposite ends of the memory string.

20 Claims, 6 Drawing Sheets

(56) References Cited

U.S. PATENT DOCUMENTS

2015/0318298 A1* 11/2015 Matsudaira ......... H01L 27/1157
   257/314
2016/0181259 A1*  6/2016 Van Houdt ......... H01L 27/1159
   365/145
2018/0122906 A1*  5/2018 Yu ..................... H01L 27/11565

* cited by examiner

V-GROOVED VERTICAL CHANNEL-TYPE 3D SEMICONDUCTOR MEMORY DEVICE AND METHOD FOR MANUFACTURING THE SAME

CROSS-REFERENCE TO RELATED APPLICATIONS

This application claims foreign priority to European Application No. EP 16206986.8, filed Dec. 27, 2016, which is incorporated by reference herein in entirety.

BACKGROUND

Field

The disclosed technology relates generally to the field of semiconductor devices and specifically to three-dimensional non-volatile memories, such as vertical NAND strings and to methods of making such devices.

Description of the Related Technology

Vertical channel, Bit Cost Scalable (BiCS) NAND memory and U-shaped (i.e. "pipe-shaped") BiCS (p-BiCS) were developed for ultra-high density storage devices. However, earlier BiCS and p-BiCS 3D NAND architectures suffer from relatively high control gate/word line resistances and capacitances. These resistances and capacitances reduce cell efficiency and increase the power consumption of the memory device.

When thus stacking many cells on a memory chip in such a NAND configuration, a complication arises how to connect the cells at the bottom of the stack. In practice such bottom connection cannot be done by a diffused region, as is done for example in NOR Flash, because such connection would cause very large series resistance. This resistance would compromise the read-out speed of the memory, having a very small read current already. Alternatively, for example, metal plugs may be used to connect the cells to the bottom, like in the Samsung V-NAND configuration as disclosed e.g. in US2010/0155810 (FIG. 1). Metal plugs could be used since this replacement gate technology requires large slits about every four cells in use. However, such manufacturing process requires very careful processing involving high aspect ratio etch and deposition thereby risking short-circuiting between the cell planes etc. As such, this approach is complicated and costly in terms of area consumption.

Another option may be to provide a pipeline in the memory chip, which connects adjacent strings at their bottom thereby creating a series connection between them. In this approach all contacts can be made at the upper side of the series connected strings as disclosed in e.g. US2014/0361360 (FIG. 2) forming a so-called horizontal pipeline. However, constructing such a horizontal pipeline in the memory array is very complicated. Layers formed have to be conformal along this 'tunnel' as well. Moreover, since the cells on the parallel sides of the pipeline belong to the same cell string, they can no longer share the same word line controlling the operation of a cell at a particular position or height in the string. As a consequence, a slit is needed between both parts of the string. Theoretically a slit would be needed every two cells, which is strongly compromises memory density.

Accordingly, there is a need for novel and improved three-dimensional non-volatile memory devices and fabrication methods thereof. Embodiments of the disclosed technology provide modification or alternatives for the BiCS and p-BiCS processes and allow high density NAND architectures with easier process control.

SUMMARY OF CERTAIN INVENTIVE ASPECTS

An objective of embodiments of the disclosed technology is to provide three-dimensional non-volatile memory devices and fabrication methods thereof.

The above objective may be accomplished by a method and device according to one or more embodiments of the disclosed technology.

In a first aspect, the disclosed technology provides a method of fabricating a memory device. The method of fabricating a vertical channel 3D semiconductor memory device according to embodiments of the disclosed technology comprises providing a stack of alternating layers of conductive material and dielectric material on a major surface of substrate, providing in the stack at least one trench, having sloped sidewalls towards the major surface, extending at least below the lowest layer of conductive material, forming, in that order, a programmable material, a channel liner and a filler material on the sidewalls of the trench, thereby forming a memory string, and forming an electrical contact to opposite ends of the channel liner. In an embodiment according to this method, the channel liner runs continuously from one sidewall of the trench to an opposite sidewall of the trench, thereby connecting opposite memory strings in series, and the electrical contacts are formed at the same side of the trench.

In one embodiment, the memory device is a ferro-electric memory whereby the programmable material is a ferroelectric material. In another embodiment, the memory device is a resistive RAM memory, whereby the programmable material is a resistive switching material. In another embodiment, the memory device is a floating gate memory, whereby the programmable material is a stack of floating gate sandwiched between two dielectrics materials.

In an embodiment, the sloped sidewalls of the V-shaped trench form an angle between 60° and 85° with the major surface of the substrate.

Embodiments providing at least one V-shaped trench may also comprise providing a trench having a trapezoidal or triangular cross section.

In a second aspect, a vertical channel 3D semiconductor memory device is disclosed, comprising a stack comprising alternating layers of conductive material and dielectric material on a major surface of a substrate, in the stack at least one trench, having sloped sidewalls towards the major surface, extending at least below the lowest layer of conductive material, whereby the trench is filled with a programmable material, a channel material and a filler material, constituting a filled V-shaped channel, and an electrical contact to opposite ends the channel liner. In one embodiment, the at least one V-shaped trench has a trapezoidal or triangular cross section.

The presence of the filler allows to have half of the cells on the left hand side and half of the cells on the right hand side of the V-shaped trench, both being part of a same string. Both extremities of the string are at the same side of the memory device, for instance at the top side, and can be connected to two different contacts. It is an advantage of embodiments of the disclosed technology that no slits are needed in between two parts of the same string, as in the pipeline of BiCS case. It is an advantage of embodiments of the disclosed technology that no metal plates are required in slits between the cell strings as in the RMG design.

One feature of embodiments of the disclosed technology is that a larger density than in any of the vertical NAND architectures known in the art is enabled, with an easier process control as there are no severe constraints on the etch angle or channel CD.

Another feature of embodiments of the disclosed technology is that a perpendicular channel, which is difficult to achieve, is not needed.

Still another feature is that there is no need for complicated select devices at the bottom of the memory stack (as in replacement metal gate and original BiCS design).

Particular and preferred aspects of the disclosed technology are set out in the accompanying independent and dependent claims. Features from the dependent claims may be combined with features of the independent claims and with features of other dependent claims as appropriate and not merely as explicitly set out in the claims.

These and other aspects of the disclosed technology will be apparent from and elucidated with reference to the embodiment(s) described hereinafter.

Figure 1:
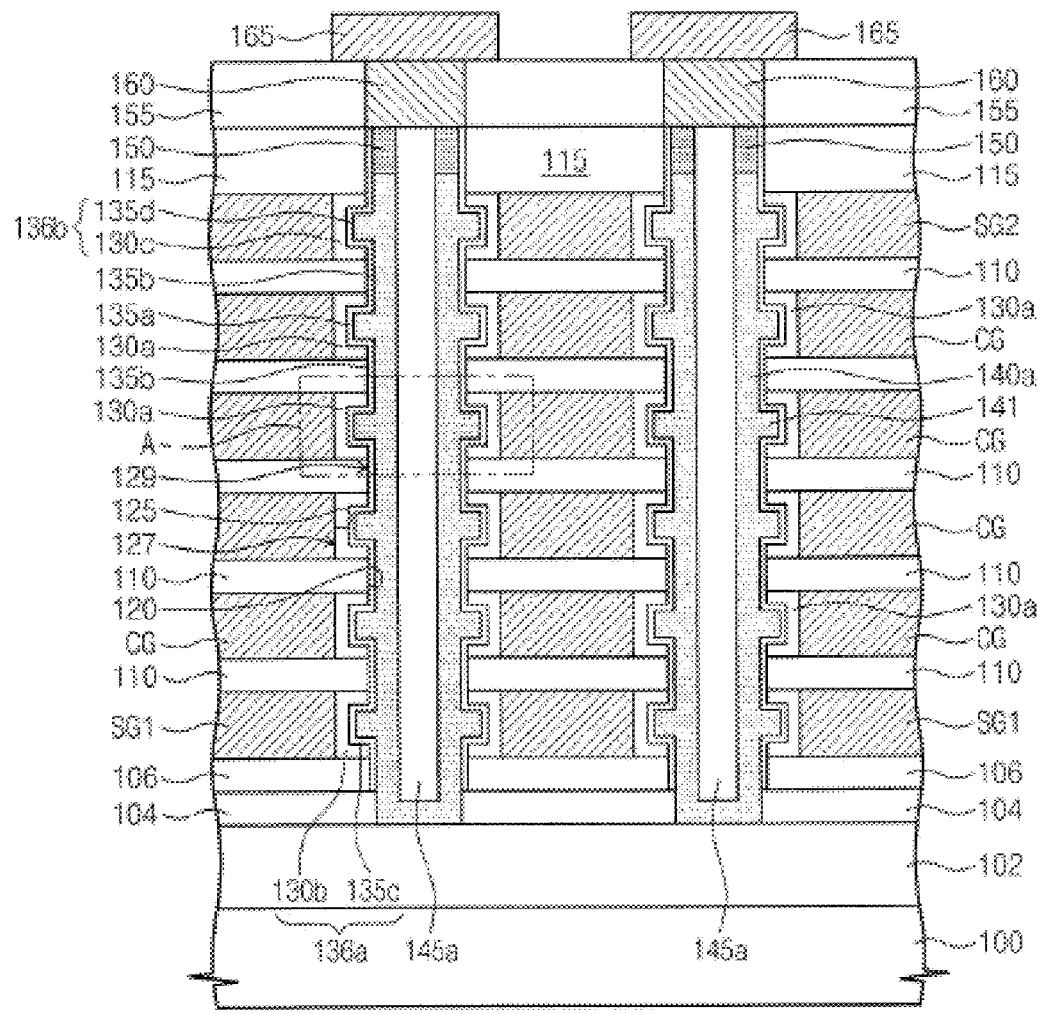
FIG. 1 is a schematic side cross-sectional view of a three-dimensional memory device known in the art.
Figure 2:
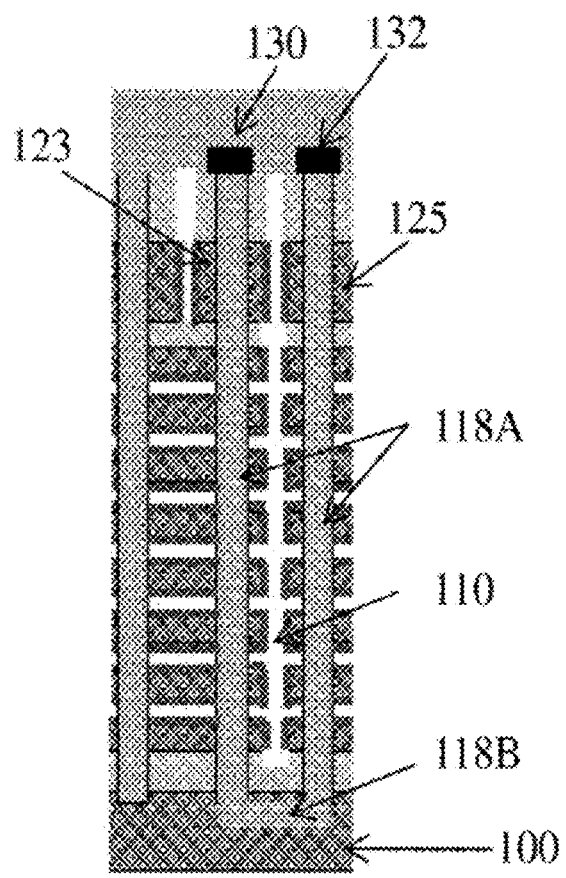
FIG. 2 is a schematic side cross-sectional view of a three-dimensional memory device known in the art.

The drawings are only schematic and are non-limiting. In the drawings, the size of some of the elements may be exaggerated and not drawn on scale for illustrative purposes. The dimensions and the relative dimensions do not correspond to actual reductions to practice of the disclosed technology. Any reference signs in the claims shall not be construed as limiting the scope. In the different drawings, the same reference signs refer to the same or analogous elements.

DETAILED DESCRIPTION OF CERTAIN ILLUSTRATIVE EMBODIMENTS

The disclosed technology will be described with respect to particular embodiments and with reference to certain drawings but the disclosed innovations are not limited thereto. The drawings described are only schematic and are non-limiting.

The terms first, second and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the disclosed technology described herein are capable of operation in other sequences than described or illustrated herein.

Moreover, the terms top, under and the like in the description and the claims are used for descriptive purposes and not necessarily for describing relative positions. It is to be understood that the terms so used are interchangeable under appropriate circumstances and that the embodiments of the disclosed technology described herein are capable of operation in other orientations than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the disclosed technology, the only relevant components of the device are A and B.

Reference throughout this specification to "one embodiment" or "an embodiment" means that a particular feature, structure or characteristic described in connection with the embodiment is included in at least one embodiment of the disclosed technology. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly, it should be appreciated that in the description of exemplary embodiments of the disclosed technology, various features of the disclosed technology are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the disclosed technology requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of the disclosed technology.

Furthermore, while some embodiments described herein include some but not other features included in other embodiments, combinations of features of different embodiments are meant to be within the scope of the disclosed technology, and form different embodiments, as would be understood by those in the art. For example, in the following claims, any of the claimed embodiments can be used in any combination.

In the description provided herein, numerous specific details are set forth. However, it is understood that embodiments of the disclosed technology may be practiced without these specific details. In other instances, well-known methods, structures and techniques have not been shown in detail in order not to obscure an understanding of this description.

As used herein, the term "control gate" and "word line" refer to the same electrically conductive entity. A control gate may be considered a portion of a word line located adjacent to and controlling one NAND cell in an array of NAND cells. A word line may control plural NAND cells in the array. Thus, the word line may be considered to be a portion of the electrically conductive entity which connects the control gates. However, it should be understood that the word line and its control gate portions may be formed during the same process step and may comprise the same one or more electrically conductive layers as will be described below.

A monolithic three-dimensional NAND string known in the art may have a U-shape (also known as a "pipe" shape) with two vertical channel wing portions, having memory cells stacked, and a horizontal channel connecting the wing portions. The U-shaped pipe channel may be fully filled resulting in a full channel or partly filled in the so-called "macaroni" case, wherein a dielectric filler is used.

More specifically, embodiments of the disclosed technology provide using a V-shaped trench providing a channel to separate two parts of a vertical NAND string.

Figure 3A:
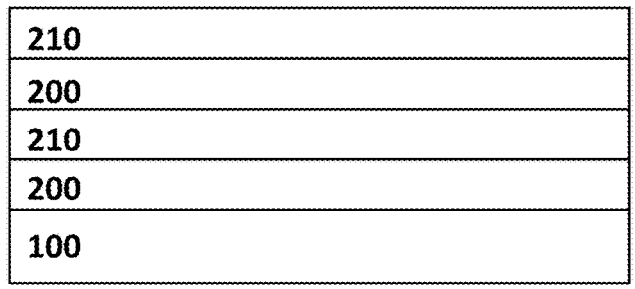
FIG. 3a-3e are schematic side cross-sectional views illustrating steps of a method of making a three-dimensional memory device according to embodiments of the disclosed technology.

FIG. 3A-3E illustrate a method of making a three-dimensional memory device, e.g. a vertical NAND string, according to embodiments of the disclosed technology. In embodiments, a substrate 100 is provided with a stack of alternating layers of a first material layer 200 and a second material layer 210 formed over a major surface of the substrate 100 as illustrated in FIG. 3A. Although in the drawings only four alternating layers are provided, this should not be considered to be restricting the disclosed technology, and more layers can be provided. In preferred embodiments the final top layer of the stack, i.e. the layer furthest from the substrate 100, is a layer of the first material layer 200.

The substrate 100 can be any semiconductor substrate known in the art, such as monocrystalline silicon, IV-IV compounds such as silicon-germanium or silicon-germanium-carbon, III-V compounds, II-VI compounds, epitaxial layers over such substrates, or any other semiconductor or non-semiconductor material, such as silicon oxide, glass, plastic, metal or ceramic substrate. The substrate 100 may include integrated circuits fabricated thereon, such as driver circuits for a memory device which is to be formed on the substrate 100.

Layers 200 and 210 may be deposited over the substrate 100 by any suitable deposition method, such as sputtering, CVD, PECVD, MBE, etc.

Preferably, the first material layer 200 is suitable for use as a control gate. Suitable materials include, but are not limited to, group IV semiconductors, such as silicon (e.g., polysilicon), silicon germanium, silicon carbide, etc. The semiconductor may be p-type or n-type doped and may have a doping concentration between $10^{17}$ cm$^{-3}$ and $10^{21}$ cm$^{-3}$.

The second material layer 210 may comprise a dielectric or insulating material (e.g. silicon oxide, silicon nitride, etc.) that may be selectively etched with respect to the first material layer 200. The second material layer 210 electrically isolates the first material layers 200.

Figure 3B:
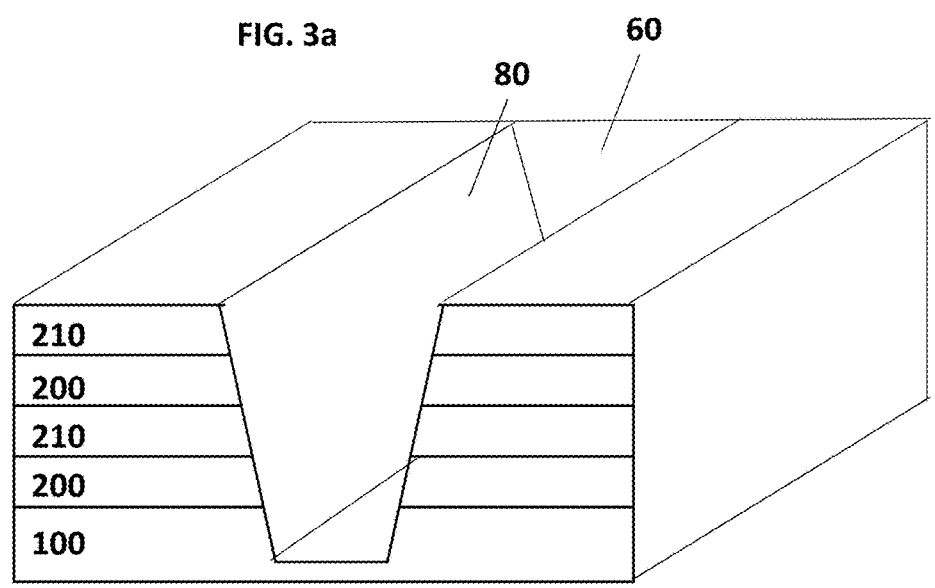

After deposition of the layers 200 and 210 onto the substrate 100, the stack may be etched to form a V-shaped trench 60 as illustrated in FIG. 3B. The V-shaped trench 60 preferably extends to the major surface of the substrate 100, or even into the substrate 100. With "V-shaped channel" is meant a trench having a width which decreases along the depth and thus towards the substrate 100, which is filled with channel material. The V-shaped trench can be filled with at least one material. For example, the channel can be filled as a whole e.g. a full channel comprising only one material or with a dielectric filler after depositing a constant thickness channel layer. As the width of the trench 60 decreases towards the substrate 100, this way of contacting the cells stacked in the string, is preferably used for memory types being less sensitive to electrical field enhancement in their operation. Preferably the disclosed method is used to form a connection for ferro-electric memory and/or for floating gate memory.

Figure 4:
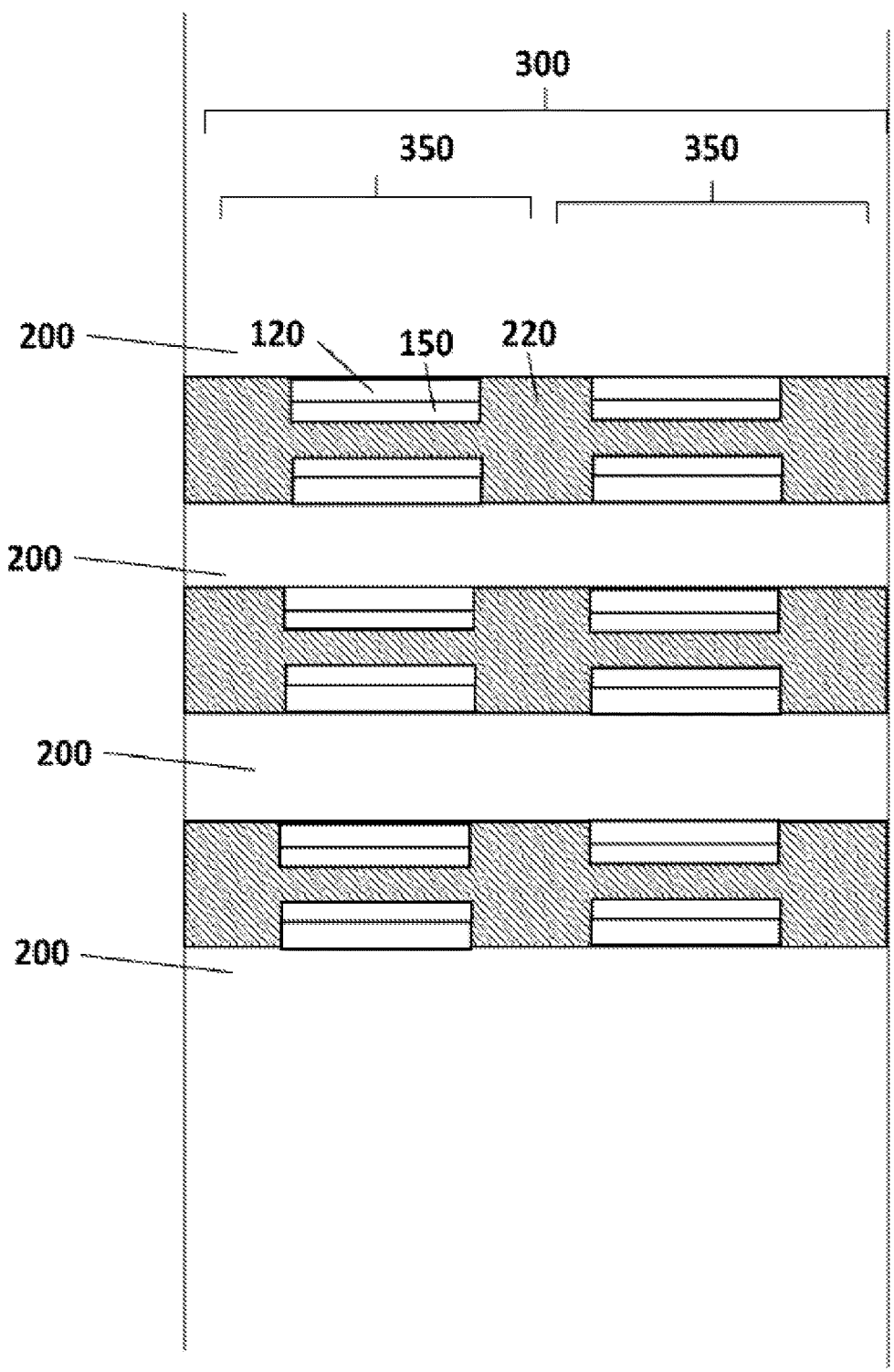
FIG. 4 illustrates a top view of a device comprising a V-shaped channel as memory cell.

The V-shaped channel or trench 60 can have a trapezoidal or triangular cross section. The V-shaped trench 60 comprises a horizontal portion at its bottom where the sloped portions are connected resulting in the V-shape. The horizontal portion may have a width or can be a point if the sloped portions intersect in a sharp tip, depending on whether trench 60 having a trapezoidal or triangular cross section is provided. When viewed from above, the V-shaped channel has a cross section which decreases in area towards the substrate. The sloped portions of the V-shaped trench of the V-shaped channel are thus not substantially perpendicular to a major surface of the substrate and form an angle therewith. In embodiments, the cross-sectional shape of the V-shaped channel, substantially parallel with a main surface of the substrate 100, may form any suitable shape, for example it may be rectangular, as illustrated in FIG. 4.

The V-shaped trench 60 of the V-shaped channel may be provided by anisotropically etching the stack formed by the layers 200, 210 on the substrate 100 through a masking material formed on top of the stack of layers 210-200. The etching step preferably is a high aspect ratio (HAR) etching step. The etching creates a pit or cavity with flat sloping sidewalls and, optionally, a flat bottom. The sloped sidewalls may comprise an angle with respect to a major surface of the substrate 100, on which the layers 210-200 are formed, of 60 to 85°. Prior art slits have substantially vertical sidewalls having an angle of at least 89°. The pit or cavity 60, when etched to completion, displays a pyramidal shape.

Figure 3C:
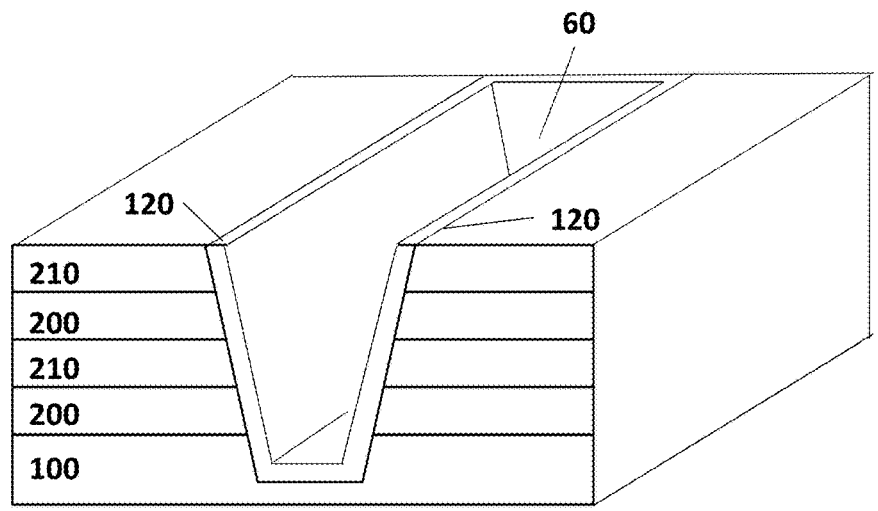
Figure 3D:
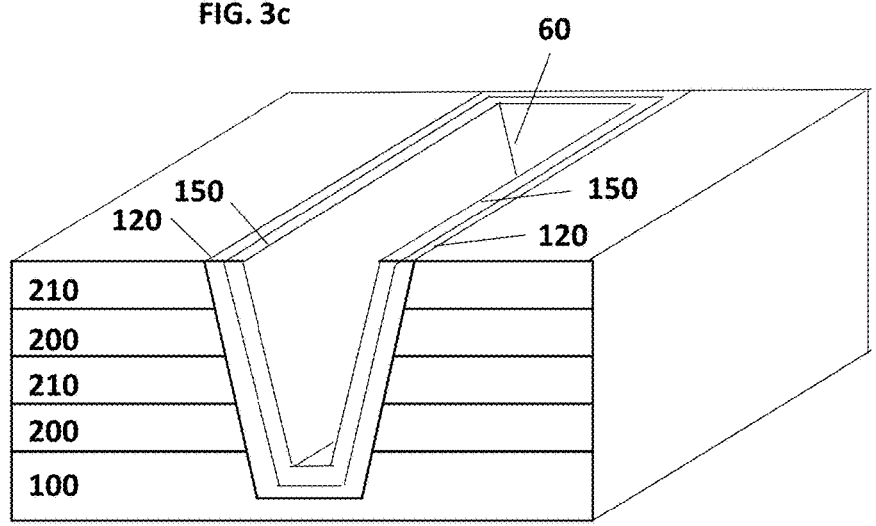

Once the V-shaped trench 60 is provided, memory cells, e.g. vertical NAND strings, may be formed on the sides 80 of the V-shaped trench 60. For example, a series of conformal deposition steps of a programmable material 120, as illustrated by FIG. 3C, a channel material 150, as illustrated by FIG. 3D, and a filler material 220 in the trench 60 will result in a memory cell string having a V-shaped channel. Conformal deposition techniques include, but are not limited to, atomic layer deposition (ALD) and chemical vapor deposition (CVD). The layers of first material 200 act as control gate at the different levels within the memory string. As will be discussed later on, if adjacent strings are not connected in series by a channel layer 150 at the bottom of trench 60 and if the trench does not extend over the full with of the wordline 200, then cells in opposing strings in the trench 60 may be controlled by the same wordline 200.

For example, a layer of programmable material 120, e.g. a HfO$_2$ layer, may first be conformally deposited on the sloped sidewalls of the V-shaped trench 60, and optionally on the bottom of the trench 60 as illustrated by FIG. 3C. Alternatively, the layer of programmable material 120 may be provided by filling the V-shaped trench 60 with the programmable material 120, followed by an etch-back thereof, for instance by a high aspect ratio (HAR) etch, such that only a conformal layer remains present on the inner surface of the trench 60. In embodiments of the disclosed technology, the programmable material 120 runs all along the entire V-shaped trench 60. In alternative embodiments, the programmable material 120 does not run all along the entire V-shaped trench, as illustrated in FIG. 4. The layer of programmable material can be a ferro-electric layer or a stack of ferro-electric layers in case of a ferro-electric memory. The layer of programmable material can be a stack of insulating/conductive/insulating layers in case of a floating gate memory. In a specific embodiment the programmable material 120 may be a resistive switching material such that it can be used as a 3D Resistive RAM (3D RRAM) device or a PCM or any resistive switching concept.

Next, a layer of channel material 150, e.g. silicon, may be conformally deposited on the layer of programmable material 120, and optionally on the horizontal bottom portion of the V-shaped trench 60 if present. Alternatively, also the layer of channel material 150 may be provided by filling the V-shaped trench 60, covered with the layer of programmable material 120, with the channel material 150, and selectively removing part of the channel material, e.g., etching it back, for instance by a high aspect ratio (HAR) etch, such that a conformal layer of channel material remains present inside the V-shaped trench on top of the programmable material 120. If the bottom portion of the channel liner 150 remains, a continuous channel liner is formed going along opposing sidewalls of the trench 60, resulting in a 'pipe-lined' memory string. If this bottom portion of the channel liner 150 is absent, e.g., by etching through the liner 150 at the bottom of the trench 60, opposing strings are not connected in series. The channel material 150 may comprise lightly doped p-type or n-type, e.g. doping below $10^{17}$ cm$^{-3}$, semiconductor material, e.g. polysilicon. An n-channel device, having n-type doped channel material, is preferred since it is easily connectable with n+ junctions, e.g. source and drain n+ doped regions having a doping concentration between $10^{17}$ cm$^{-3}$ and $10^{21}$ cm$^{-3}$ located at the opposite ends of each channel in case no pipe-line is formed. However, a p-channel device, having p-type doped channel material, may also be used. Other semiconductor materials, e.g. Si, SiGe, SiC, Ge, III-V, II-VI, etc., may also be used.

Figure 3E:
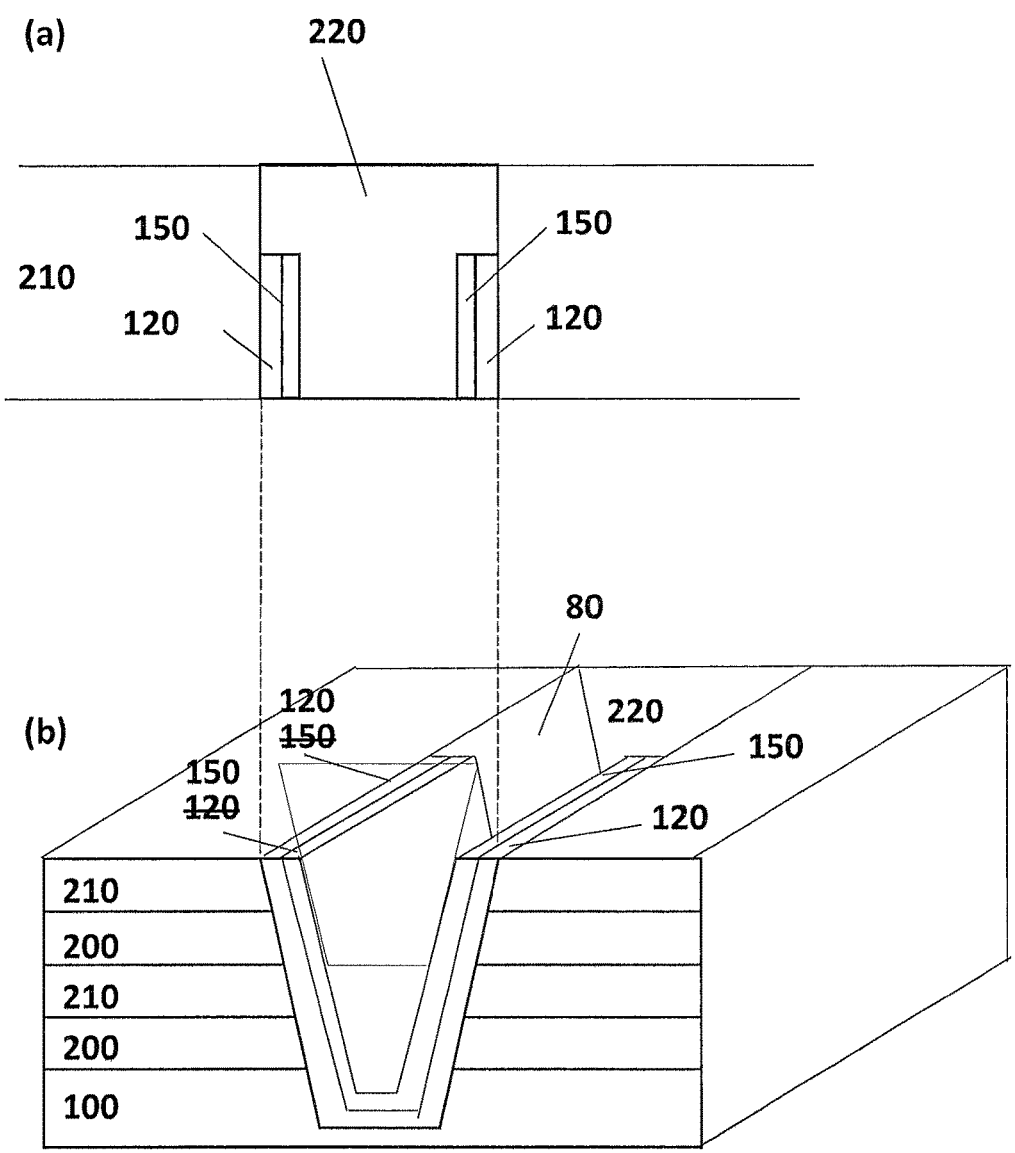

After depositing the layer of channel material 150 on the layer of programmable material 120, the layer of channel material 150 may be patterned, preferably by a high aspect ratio (HAR) etch. This patterning of the layer of channel material 150 splits the channel in a plurality of shorter channels in a direction along the width of the trench 60 as illustrated in FIG. 3E (a). In embodiments, as illustrated in FIG. 3E (a), one could optionally etch or remove the programmable material 120, e.g., HfO2 layer, at the same time as the channel material liner 150. If the programmable material 120 is not conductive, it need not to be removed as short-circuiting different cells in the same string or in adjacent strings having the trench 60 in common will not occur. Hence the (second) HAR etch for patterning the channel material 150 does not have to be selective to the programmable material 120. The second HAR etch, patterning the channel liner 150, may be only selective with respect to the first 200 and second materials 210 of the stack.

In a next step, a filler material 220 is provided in the partially filled trench 60 as illustrated in FIG. 3E, overlying the channel liner 150. The shape of the filler material 220 in a cross section substantially perpendicular to a main surface of the substrate 100 can be trapezoidal or triangular (with a sharp tip at the bottom and thus not comprising a horizontal part), as illustrated in FIG. 3E (b). A top view is given in FIG. 3E (a). The filler material 220 may comprise a silicon oxide layer deposited by conformal atomic layer deposition (ALD) or chemical vapor deposition (CVD). Other high-k dielectric materials, such as hafnium oxide, may be used instead or in addition to silicon oxide.

As a result, by using a V-shaped vertical trench architecture, the memory devices or memory cells are constructed along the sloped sidewalls of the trench. A filler material 220, e.g. dielectric filler such as an oxide, is used to separate and isolate the two opposing parts of the string as illustrated in FIG. 3E. Instead of using a cylindrical filler as in plug-based architectures, in embodiments of the disclosed technology a pyramidal or triangular filler 220 is used which is much easier in terms of filling accuracy. If there is a residual piece of the channel material 150 at the bottom of the trench 60, as illustrated in FIG. 3E (b), it connects adjacent and opposing strings thereby making a connection which is the equivalent to the much more complicated pipeline in the pipeline BiCS discussed in the prior art section: in the disclosed method a series connection is created without costing any additional area.

A minor drawback could be that the filler material 220 has to fill the trench 60 until below the last control gate 200 in the stack, to ensure that the bottom cells are still separately addressable as the channel liner 150 will be below the level of the last control gate. This can be easily resolved by providing more margin at the bottom oxide thickness separating the lowest control gate from the substrate, such that a deeper trench 60 can be formed. The electrical crosstalk between the opposing bottom cells has to be checked since they are more closely together than those at the top of the string, in view of the presence of the V-shaped trench.

In an embodiment, a surface of the first material layer 200, e.g., control gate layer, and of the second material layer 210, e.g. dielectric layer, directly, physically contacts the sidewalls of the V-shaped channel, and thus the programmable material 120, as for example illustrated in FIG. 3E (b).

FIG. 4 schematically illustrates a top view of a memory area 300, comprising a at least one memory cell 350 based on channel 150 formed at least along the sidewalls of a V-shaped trench 60, as described above. The device illustrated in FIG. 4 is enabled by providing a stack of alternating control gate layers 200 and one or more dielectric or insulating materials 210 on a substrate. The alternating layers, are provided such that the control gate layer 200 is on top as illustrated in FIG. 4.

In the embodiment illustrated in FIG. 4, once the stack of alternating control gate layers 200 and dielectric layers 210 is provided on the substrate 100, in a next step one or more V-shaped trenches are defined therein, illustrated as in FIG. 3B. In these trenches wherein a plurality of materials are deposited, illustrated as in FIG. 3C-3E, resulting in a V-shaped channel 150 which acts as memory cell.

In FIG. 4, instead of using a conventional, plug-based trench FeFET with a metal gate "ring" surrounding the circular plug containing the channel liner, (as seen from above), one advantageously limits the density loss by using a V-shaped trench comprising a ferroelectric as programmable material.

In a next step, at least one selected electrode, e.g., a contact electrode, may be deposited, which preferably contacts the channel liner 60 from above. It is an advantage of embodiments of the disclosed technology that when contacts are added, source line (SL) and bit line (BL) connections may be provided on the V-shaped channel at the top in case of a pipe-lined architecture. Both BL selector and SL selector devices may be formed by e.g. providing two different metals which are crossing each other. In memory architectures having no pipe-line, separate SL and BL selectors have to be manufactured in the string, e.g. one at the top of the memory string and the other one at the bottom of the memory string.

Embodiments of the disclosed technology can be applied to all 3D NAND and RRAM-type memories that are not relying on field enhancement. These could be used in, but not limited to, FeFET, RRAM, CBRAM, memristor or any other type of cross-point memory where the cell is constructed vertically on the chip. As a result, the V-shaped channel according to embodiments of the disclosed technology is not for use in plug-based architectures (where tunneling is used for programming and erasing) because then the difference between the top and bottom cells in terms of program/erase speed would be too large due to the field enhancement effect. In other words, for these applications, the angle of the etch has to be very close to 90 degrees which makes a V-shape as in accordance to embodiments of the disclosed technology substantially impossible. However, if another mechanism is used (such as, e.g., ferroelectric switching) that does not rely on field enhancement, the cells will not show this variation and the 'tunnel' can be replaced by a small piece of, e.g., semiconductor material such as silicon at the bottom (on the horizontal portion) which comes naturally from the trench formation with a relaxed etch angle.

The foregoing description details certain embodiments of the disclosed technology. It will be appreciated, however, that regardless of how detailed the foregoing appears in text, the disclosed technology may be practiced in many ways. It should be noted that the use of particular terminology when describing certain features or aspects of the disclosure should not be taken to imply that the terminology is being re-defined herein to be restricted to including any specific characteristics of the features or aspects of the disclosure with which that terminology is associated.

While the above detailed description has shown, described, and pointed out novel features of the disclosed technology as applied to various embodiments, it will be understood that various omissions, substitutions, and changes in the form and details of the device or process illustrated may be made by those skilled in the technology without departing from the disclosed innovations.

What is claimed is:

1. A method of fabricating a vertical channel 3D semiconductor memory device, the method comprising:
   providing a stack of alternating layers of conductive material and dielectric material on a major surface of substrate, wherein the stack includes a top layer of the conductive material;
   providing in the stack at least one trench, having sloped sidewalls sloping towards the major surface, extending at least below a lowest layer of conductive material and through the major surface of the substrate;
   forming, in order, a programmable material, a channel liner and a filler material on the sloped sidewalls of the at least one trench, thereby forming a memory string; and
   forming electrical contacts on opposite ends of the channel liner.

2. The method of claim 1, wherein:
   the channel liner runs continuously from one sloped sidewall of the at least one trench to an opposite sloped sidewall of the at least one trench, thereby connecting opposite memory strings in series; and
   wherein the electrical contacts are formed at a same side of the at least one trench.

3. The method of claim 2, wherein:
   the memory device is a resistive random access memory (RAM), wherein the programmable material is a resistive switching material.

4. The method of claim 3, wherein the sloped sidewalls of the at least one trench form an angle between 60° and 85° with the major surface of the substrate.

5. The method of claim 4, wherein the at least one trench has a trapezoidal or triangular cross section.

6. The method of claim 2, wherein:
   the memory device is a floating gate memory, wherein the programmable material is a stack of floating gate sandwiched between two dielectrics materials.

7. The method of claim 6, wherein the sloped sidewalls of the at least one trench form an angle between 60° and 85° with the major surface of the substrate.

8. The method of claim 7, wherein the at least one trench has a trapezoidal or triangular cross section.

9. The method of claim 2, wherein the sloped sidewalls of the at least one trench form an angle between 60° and 85° with the major surface of the substrate.

10. The method of claim 2, wherein the at least one trench has a trapezoidal or triangular cross section.

11. The method of claim 2, wherein:
    the memory device is a ferro-electric memory wherein the programmable material is a ferroelectric material.

12. The method of claim 11, wherein the sloped sidewalls of the at least one trench form an angle between 60° and 85° with the major surface of the substrate.

13. The method of claim 12, wherein the at least one trench has a trapezoidal or triangular cross section.

14. The method of claim 1, wherein:
    the memory device is a ferro-electric memory wherein the programmable material is a ferroelectric material.

15. The method of claim 1, wherein:
    the memory device is a resistive random access memory (RAM), wherein the programmable material is a resistive switching material.

16. The method of claim 1, wherein:
    the memory device is a floating gate memory, wherein the programmable material is a stack of floating gate sandwiched between two dielectrics materials.

17. The method of claim 1, wherein the sloped sidewalls of the at least one trench form an angle between 60° and 85° with the major surface of the substrate.

18. The method of claim 1, wherein the at least one trench has a trapezoidal or triangular cross section.

19. A vertical channel 3D semiconductor memory device, comprising:
    a stack comprising alternating layers of conductive material and dielectric material on a major surface of a substrate, wherein the stack includes a top layer of the conductive material;
    in the stack at least one trench, having sloped sidewalls sloping towards the major surface, extending at least below a lowest layer of conductive material and through the major surface of the substrate;
    wherein the at least one trench is filled with a programmable material, a channel liner, and a filler material, constituting a filled channel; and
    electrical contacts on opposite ends of the channel liner.

20. The vertical channel 3D semiconductor memory device according to claim 19, comprises the at least one trench having a trapezoidal or triangular cross section.

* * * * *